United States Patent
Yang et al.

(10) Patent No.: US 10,320,181 B1
(45) Date of Patent: Jun. 11, 2019

(54) FAILURE DETECTION AND ALERTING CIRCUIT FOR A COMMON MODE SURGE PROTECTION DEVICE IN AN LED DRIVER

(71) Applicant: Universal Lighting Technologies, Inc., Madison, AL (US)

(72) Inventors: Haiqing (Paul) Yang, Madison, AL (US); Keith Davis, Madison, AL (US); Wei Xiong, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 15/797,398

(22) Filed: Oct. 30, 2017

Related U.S. Application Data

(60) Provisional application No. 62/416,762, filed on Nov. 3, 2016.

(51) Int. Cl.
| | |
|---|---|
| *H01C 7/12* | (2006.01) |
| *H02H 5/04* | (2006.01) |
| *G08B 21/18* | (2006.01) |
| *F21V 25/10* | (2006.01) |
| *G01R 31/327* | (2006.01) |

(52) U.S. Cl.
CPC ............ *H02H 5/047* (2013.01); *F21V 25/10* (2013.01); *G08B 21/185* (2013.01); *G01R 31/3275* (2013.01); *H01C 7/12* (2013.01)

(58) Field of Classification Search
None
See application file for complete search history.

(56) References Cited

U.S. PATENT DOCUMENTS

| | | | | |
|---|---|---|---|---|
| 7,382,596 B2* | 6/2008 | DeBella | ............... | H04N 5/77 |
| | | | | 361/118 |
| 7,679,878 B2* | 3/2010 | Maggiolino | ............ | H02H 9/04 |
| | | | | 361/111 |
| 7,933,106 B2* | 4/2011 | Brown | .................. | H02H 9/042 |
| | | | | 361/104 |
| 8,027,138 B2* | 9/2011 | Maggiolino | ............ | H02H 9/04 |
| | | | | 361/119 |
| 8,116,058 B2* | 2/2012 | Qin | .................... | H04L 69/40 |
| | | | | 361/111 |
| 9,379,533 B1* | 6/2016 | Xiong | ................... | H02H 3/08 |

(Continued)

*Primary Examiner* — Dion Ferguson
*Assistant Examiner* — Srinivas Sathiraju
(74) *Attorney, Agent, or Firm* — Patterson Intellectual Property Law, P.C.; Gary L. Montle; Alex H. Huffstutter

(57) ABSTRACT

A surge protection device for an LED lighting system provides a failure detection circuit which shuts off an indicator lamp when upon failure of surge protection components. Surge suppression circuits are coupled between respective first and second, and second and third lines for receiving an AC mains input. The surge suppression circuits include a thermal cutoff device and a clamping device, with a fault detection circuit coupled between each respective series circuit. The fault detection circuit activates an indicator lamp when the surge protection device is in a normal operation mode. The fault detection circuit shuts off the indicator lamp when the surge protection device is in a short circuit fault mode, corresponding to failure of at least one component from a surge suppression circuit. Detection of an unlit indicator lamp may serve as a warning to an operator that the associated surge protection device should be replaced.

13 Claims, 3 Drawing Sheets

(56) References Cited

U.S. PATENT DOCUMENTS

| | | | | |
|---|---|---|---|---|
| 9,462,655 | B1* | 10/2016 | Davis | H05B 33/0887 |
| 9,520,711 | B1* | 12/2016 | Xiong | H02H 7/122 |
| 9,674,907 | B1* | 6/2017 | Xiong | H05B 33/0815 |
| 9,913,346 | B1* | 3/2018 | Xiong | H05B 33/0887 |
| 9,913,354 | B1* | 3/2018 | Yang | H05B 37/0272 |
| 9,933,147 | B2* | 4/2018 | Wang | F21V 25/10 |
| 10,004,123 | B1* | 6/2018 | Yang | H01C 7/12 |
| 2014/0168845 | A1* | 6/2014 | Charles | H01H 37/767 |
| | | | | 361/104 |
| 2014/0211355 | A1* | 7/2014 | Chen | H01C 7/102 |
| | | | | 361/105 |
| 2016/0329701 | A1* | 11/2016 | Bandel | H02H 3/04 |
| 2017/0352994 | A1* | 12/2017 | Casanova | H01R 24/48 |

\* cited by examiner

FAILURE DETECTION AND ALERTING CIRCUIT FOR A COMMON MODE SURGE PROTECTION DEVICE IN AN LED DRIVER

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of U.S. Provisional Patent Application No. 62/416,762, filed Nov. 3, 2016, and which is hereby incorporated by reference.

BACKGROUND

The present invention relates generally to surge protection devices. More particularly, this present invention pertains to surge protection devices for LED driver systems and a method for alerting users as to the need to replace failed surge protection components.

LED technology has changed the way the world sees lighting. The various benefits of LED lighting, e.g. their long life, high efficacy, green energy, high level of flexibility and dimmability call for perfectly matched power supplies (LED drivers). In order to leverage the benefit of long life of LEDs, LED drivers must also be designed to be robust under lighting power surge conditions. Electronic light emitting diode (LED) drivers are subject to significant surges on the input lines. In many conventional applications, electronic LED drivers, and the LEDs themselves, are protected by surge suppressor circuits which are connected in parallel with the inputs of the LED drivers. Such surge suppressor circuits may also conventionally include clamping devices such as metal oxide varistors (MOVs). In practice, these devices may be provided with a rated working voltage slightly higher than a maximum AC input voltage specified for the respective LED driver. For example, an MOV rated for 320 Vrms may be used in 120/277 Vac input applications. The clamping devices in such configurations will remain non-conductive during normal operation, and can therefore operate continuously across AC power lines as the voltage across the devices is well below their respective "clamping voltage."

However, the performance of surge suppressors containing MOVs degrades with each surge event, or may even be destroyed entirely in the event of a lightning strike or the like wherein the energy involved from AC lines to earth ground (GND) is typically many orders of magnitude greater than the device can reasonably handle. Such uncontained damages to the surge protection devices are usually in violation of many safety standards such as UL1449.

In addressing these problems, it is further known to use an internally thermally fused surge protection device, whereas in the event of overheating due to the abnormal overvoltage during a lightning strike or the like, the thermally activated element in the surge protection device opens and protects associated MOVs from being violently damaged. However, one drawback to this solution is that there is no apparent indication to users that any of the device components have failed. Any large successive voltage surges can accordingly damage the entire LED driver, an expensive prospective replacement.

It would be desirable to provide an inexpensive method for an operator to determine the status of a surge suppression system that is usually inconveniently located, e.g., at the top of a pole or ceiling of a warehouse. This is especially problematic wherein determining system status requires a physical measurement.

It would further be desirable that indication of a failed surge suppressor can allow replacement of an inexpensive component in an expensive system before damage occurs to the remaining system.

BRIEF SUMMARY

The following disclosure demonstrates a novel method of detecting failed clamping devices or similar components in a surge suppression circuit and automatically shutting off an indicator lamp to alter the operator to the need to replace the surge suppressor. The indication of a failed surge suppressor may provide real-time and transparent indications to users before damage occurs to the LED driver or associated LEDs.

In another exemplary aspect of the present disclosure, a single fault detection circuit may be provided to detect failure for either surge suppression circuit in the common-mode path.

In one embodiment, the surge protection device includes a first suppression circuit coupled between first and second input lines for receiving an AC mains and a second suppression circuit coupled between second and third input lines for receiving the AC mains. Each surge suppression circuit may include a thermal cutoff device and a clamping device in series with an output node there between.

The surge protection device may further include a fault detection circuit with an indicator lamp couple between the respective output nodes of the first and second surge suppression circuits. The indicator lamp of the fault detection circuit is lit in a normal operation mode and is unlit in a short circuit fault mode.

When the surge protection device is in the normal operation mode, the clamping devices of the first and second surge suppression circuits are in a high impedance state and the thermal cutoff devices of the first and second surge suppression circuits are short circuited, thus allowing current to flow through the fault detection circuit to activate the indicator lamp.

When the surge protection device is in the short circuit fault mode, at least one of the surge suppression circuits has failed and created an open circuit, which causes the indicator lamp from the fault detection circuit to shut off.

Detection of an unlit indicator lamp may serve as a warning to an operator that the associated surge protection device component should be replaced.

DETAILED DESCRIPTION

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices.

The term "circuit" means at least either a single component or a multiplicity of components, either active and/or passive, that are coupled together to provide a desired function. Terms such as "wire," "wiring," "line," "signal," "conductor," and "bus" may be used to refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Figure 1:
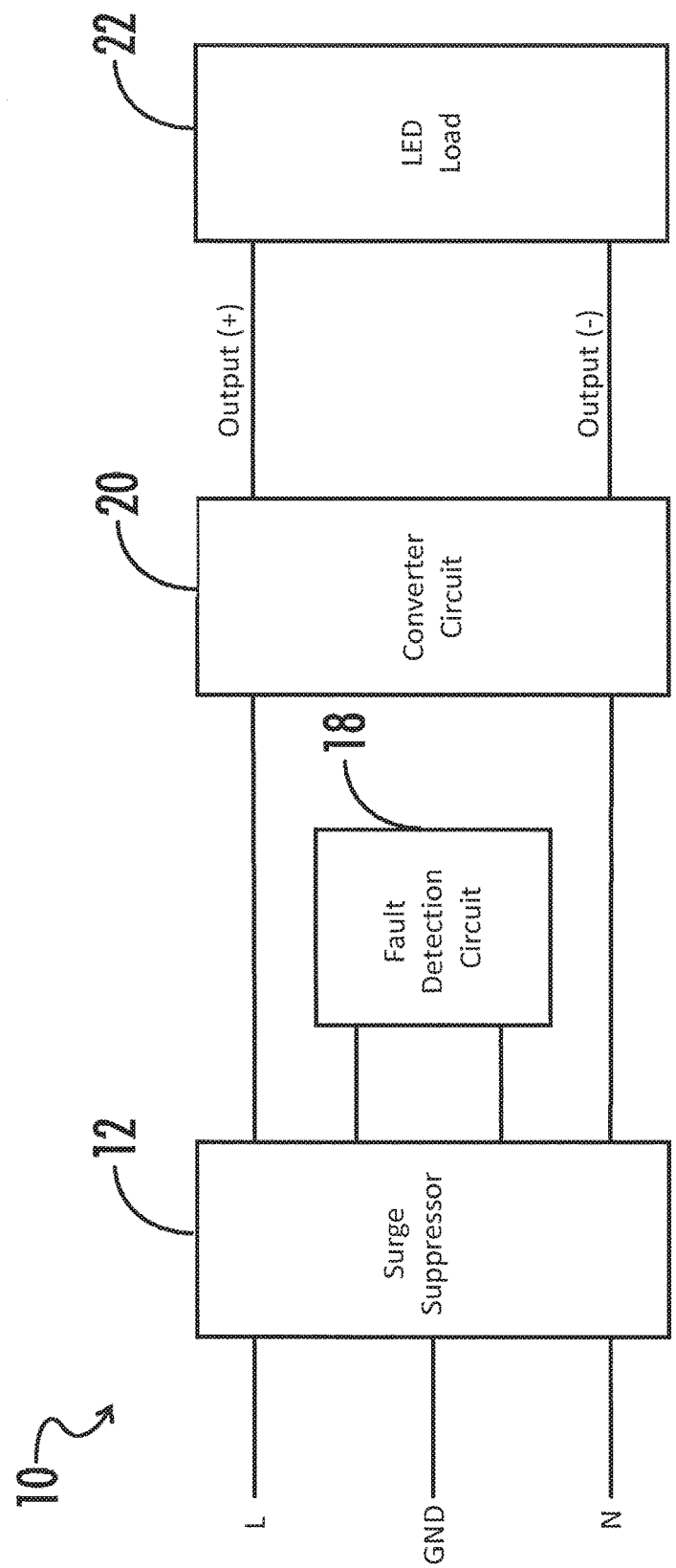
FIG. 1 is a block diagram representing an exemplary embodiment of an LED driving system including a surge protection device as disclosed herein.

Referring first to FIG. 1, one or more exemplary embodiments of a light system 10 having a surge suppressor 12 and a fault detection circuit 18 coupled thereto are shown. The lighting system 10 may include a converter circuit 20 such as for example an LED driver for driving an LED load 22. The converter circuit 20 and the lighting load 22 may be provided in separate devices with respective housings, such as for example in the case of an LED driver and LED circuit as commonly mounted within a light fixture or in a distributed lighting system. Alternatively, the converter circuit 20 and the lighting load 22 may be provided as an integrated device or fixture, equally within the scope of various embodiments as disclosed herein.

The term "LED driver" or "LED driver circuit" unless otherwise defined herein may generally refer to a device, circuit, or combination of elements as known to one of skill in the art for driving a load comprising one or more light-emitting diodes (LEDs), potentially including but not limited to any specific combination of components comprising an AC-DC input power rectifier, a power factor correction (PFC) stage, DC-DC power converters of various forms such as buck, boost, buck-boost and the like.

Figure 2:
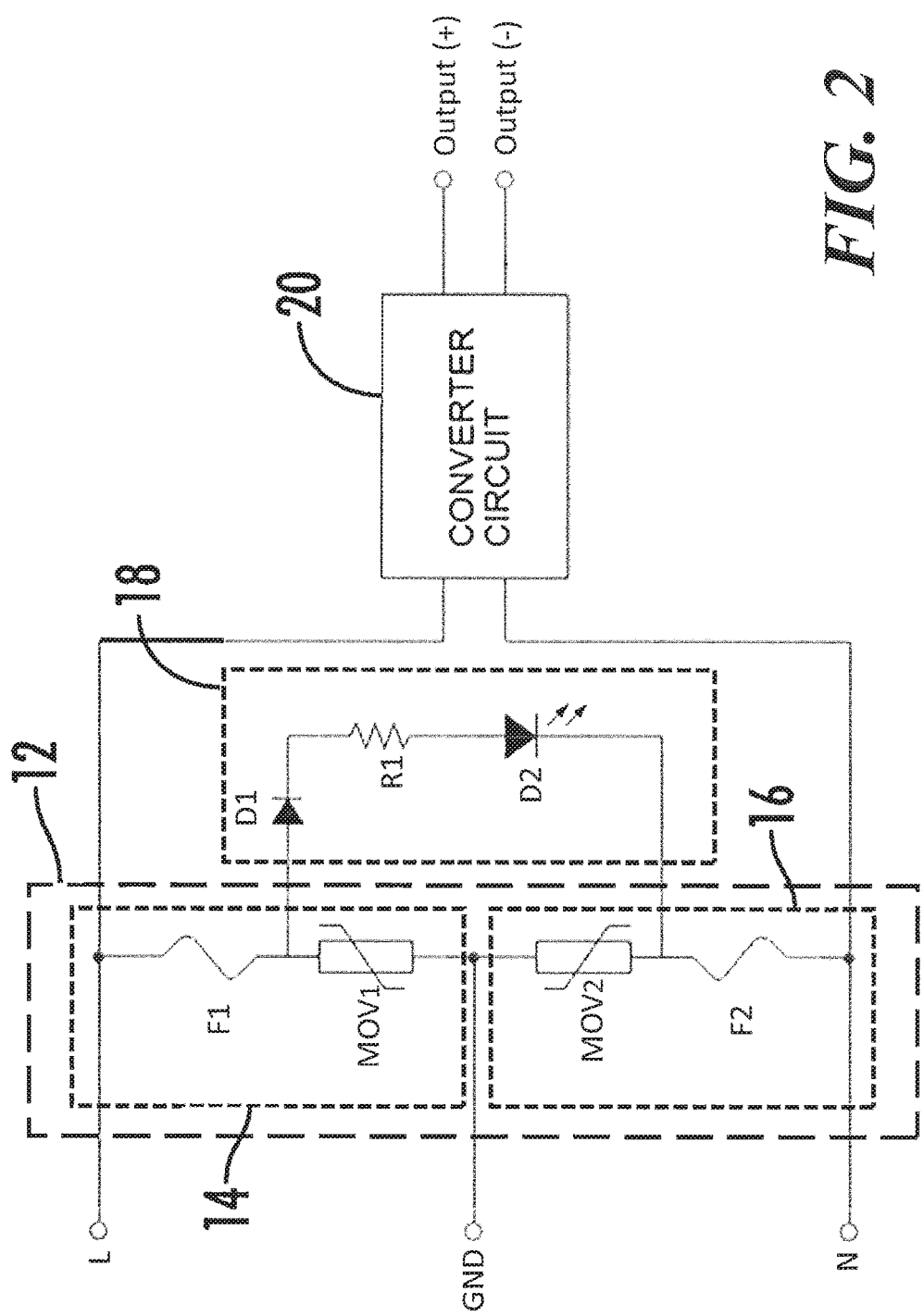
FIG. 2 is a circuit diagram representing an exemplary embodiment of the surge protection device according to FIG. 1.

Referring now to FIG. 2, an exemplary surge suppressor 12 as disclosed herein may be connected in parallel with, or otherwise stated across respective input connections to, the converter circuit 20. In an exemplary embodiment, the surge suppressor 12 may include a first surge suppression circuit 14 coupled between a voltage input line L and a ground input line GND and a second surge suppression circuit 16 coupled between a neutral input line N and the ground input line GND. Each of the first and second surge suppression circuits 14, 16 include a thermal cutoff device such as a thermal fuse (F) connected in series with a clamping device such as a metal oxide varistor (MOV).

In the illustrated embodiment of FIG. 2, the first surge suppression circuit 14 includes a first thermal fuse F1 coupled on a first end to the voltage input line L and on a second end to a first metal oxide varistor MOV1, which is further coupled to the ground input line GND. The second surge suppression circuit 16 includes a second thermal fuse F2 coupled on a first end to the neutral input line N and on a second end to a second metal oxide varistor MOV2, which is further coupled to the ground input line GND.

In the illustrated embodiment, the fault detection circuit 18 is coupled between the first surge suppression circuit 14 and the second surge suppression circuit 16. More particularly, the fault detection circuit 18 is coupled at a first end to a respective node of the first surge suppression circuit 14 between the first thermal fuse F1 and first metal oxide varistor MOV1 and coupled at a second end to a respective node of the second surge suppression circuit 16 between the second thermal fuse F2 and second metal oxide varistor MOV2.

Referring to FIG. 2, some embodiments of the fault detection circuit 18 include a rectifying diode D1 coupled on a first end to the respective node of the first surge suppression circuit 14 and on a second end to a resistor R, which is coupled to an indicator lamp D2, which is further coupled to the respective node of the second surge suppression circuit 16. The indicator lamp D2 may be a unidirectional light emitting diode. The resistor R is selected to limit the current flowing through the indicator lamp D2. The rectifier diode D1 may be configured to allow only half of the AC mains cycle flowing through the resistor R. The rectifying diode D1 accordingly reduces power consumption on the resistor R which allows a smaller resistor to be used.

Figure 3:
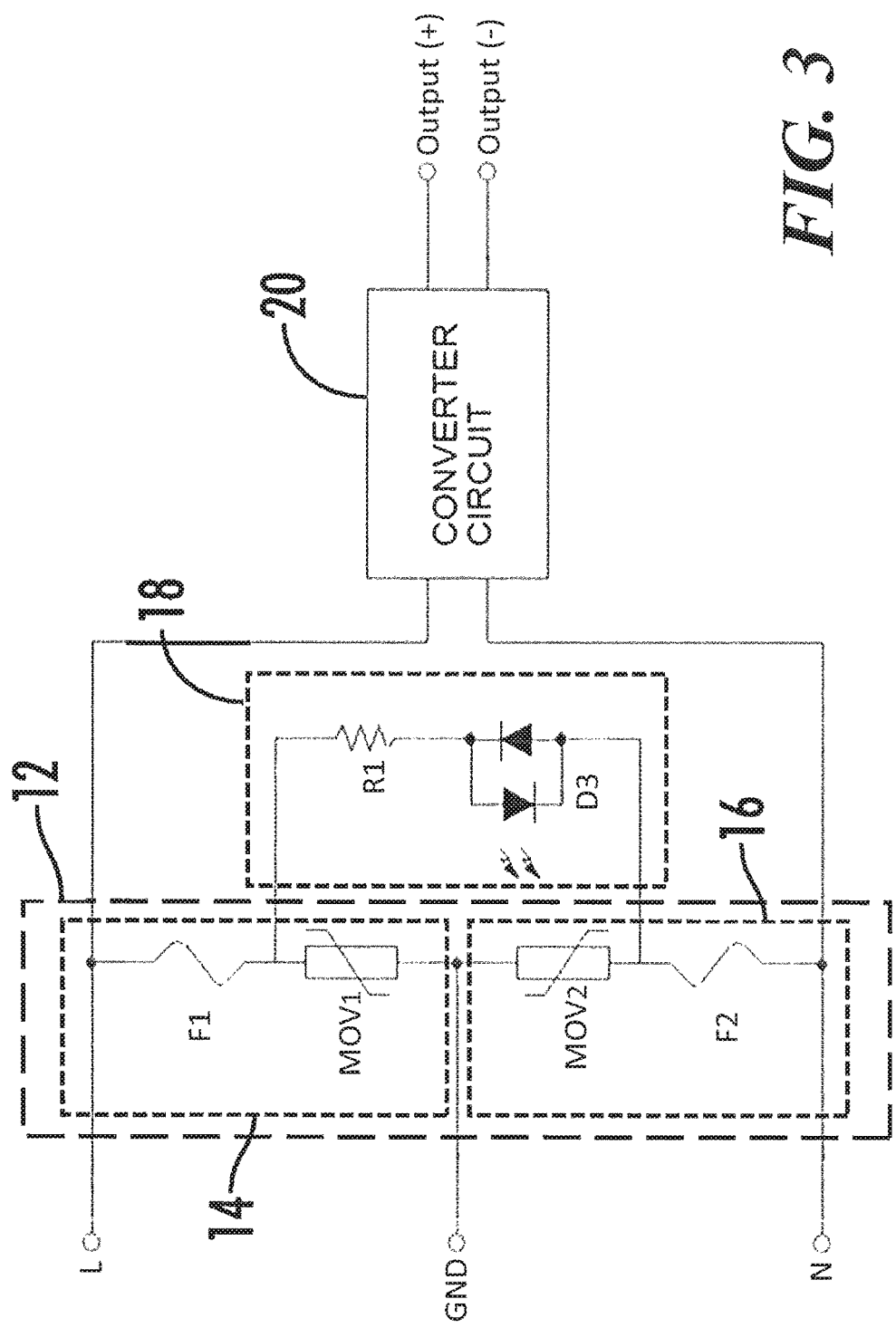
FIG. 3 is a circuit diagram representing another exemplary embodiment of the surge protection device according to FIG. 1.

Referring now to FIG. 3, other embodiments may be considered, especially for applications where printed circuit board space is more relatively available. As illustrated, a particular embodiment of the fault detection circuit 18 may include the resistor R coupled on a first end to the respective node of the first surge suppression circuit 14 and on a second end to an indicator lamp D3, which is further coupled to the respective node of the second surge suppression circuit 16. The indicator lamp D3 in examples such as the illustrated embodiment may be a bidirectional light emitting diode. The bidirectional lamp D3 of the present embodiment enables more current to flow there through, thereby further being lit more brightly than, for example, the indicator lamp D2 in the previously disclosed embodiment.

In a normal operation mode, the MOVs are in a high impedance state and do not affect the circuit and the thermal fuses are short circuited allowing current to flow through the fault detection circuit. The fault detection circuit 18 is configured to respond to the normal operation mode by activating the indicator lamp D2 or D3 depending on the particular embodiment of the fault detection circuit. The indicator lamp being lit indicates to an operator that the components of the first and second surge suppression circuits 14, 16 are functioning properly.

In a fault mode, at least one of the MOVs has failed. More particularly regarding the first and second surge suppression circuits 14, 16, the respective thermal fuses are in place to protect the circuit upon failure of a metal oxide varistor MOV. When a MOV fails, the thermal fuse quickly heats and opens, thereby creating an open circuit to protect the circuit from an over-current situation. The fault detection circuit 18 is short circuited in the fault mode and thereby shuts off the indicator lamp D2 or D3 depending on the particular embodiment of the fault detection circuit. The indicator lamp being unlit indicates to an operator that the at least one of the components of the first or second surge suppression circuits 14, 16 have failed and need replaced before another surge event occurs and damages converter circuit 20 or LED load 22.

Although there have been described particular embodiments of a new and useful invention, it is not intended that such references be construed as limitations upon the scope of this invention except as set forth in the following claims.

What is claimed is:

1. A surge protection device for a lighting system, the device comprising:
   first, second, and third input lines;
   a first surge suppression circuit coupled between the first input line and the second input line;
   a second surge suppression circuit coupled between the second input line and the third input line;
   a fault detection circuit coupled between the first surge suppression circuit and the second surge suppression circuit and configured responsive to a normal operation mode to activate an indicator lamp and responsive to a short circuit fault mode to shut off the indicator lamp;
   the first surge suppression circuit comprising a first thermal cutoff device coupled to the first input line and in series with a first clamping device coupled to the second input line, the fault detection circuit coupled at a first end to a respective node between the first thermal cutoff device and the first clamping device; and
   the second surge suppression circuit comprising a second clamping device coupled to the second input line and in series with a second thermal cutoff device coupled to the third input line, the fault detection circuit coupled at a second end to a respective node between the second clamping device and the second thermal cutoff device.

2. The surge protection device of claim 1, wherein the fault detection circuit comprises:
   a rectifying diode coupled at a first end to the respective node of the first surge suppression circuit;
   a resistor in series with the rectifying diode; and
   the indicator lamp coupled between the resistor and the respective node of the second surge suppression circuit.

3. The surge protection device of claim 2, wherein the indicator lamp is a unidirectional light emitting diode.

4. The surge protection device of claim 1, wherein the fault detection circuit comprises:
   a resistor coupled to the respective node of the first surge suppression circuit; and
   the indicator lamp coupled between the resistor and the respective node of the second surge suppression circuit.

5. The surge protection device of claim 1, wherein the indicator lamp is a bidirectional light emitting diode.

6. The surge protection device of claim 1, wherein the first input line comprises a line voltage, the second input line comprises a ground, and the third input line comprises a neutral.

7. The surge protection device of claim 1, wherein each of the thermal cutoff devices in the first and second surge suppression circuits comprises a thermal fuse.

8. The surge protection device of claim 1, wherein each of the clamping devices in the first and second surge suppression circuits comprises a metal oxide varistor.

9. The surge protection device of claim 1, wherein each of the first and second clamping devices independently degrades with each successive surge event until failure.

10. A system for driving an LED load, comprising:
    line voltage, ground, and neutral input line terminals for receiving an AC mains;
    a converter circuit configured to convert AC power received via line, ground, and neutral input lines coupled to the respective line, ground, and neutral input line terminals into DC power for driving the LED load;
    a surge protection device comprising:
      a first surge suppression circuit coupled between the line input line and the ground input line;
      a second surge suppression circuit coupled between the ground input line and the neutral input line; and
      a fault detection circuit coupled between the first surge suppression circuit and the second surge suppression circuit, the fault detection circuit configured responsive to a normal operation mode to activate an indicator lamp and responsive to a short circuit fault mode to shut off the indicator lamp;
    the first surge suppression circuit comprising a first thermal cutoff device coupled in series with a first clamping device, the fault detection circuit coupled at a first end to a respective node between the first thermal cutoff device and the first clamping device; and
    the second surge suppression circuit comprising a second clamping device coupled in series with a second thermal cutoff device, the fault detection circuit coupled at a second end to a respective node between the second clamping device and the second thermal cutoff device.

11. The system of claim 10, wherein each of the first and second clamping devices independently degrades with each successive surge event until failure.

12. The system of claim 11, wherein
    current is provided to the fault detection circuit during the normal operation mode; and
    current is diverted away from the fault detection circuit during the short circuit fault mode.

13. A method of determining surge protection capability in an LED lighting system, the method comprising:
    providing a surge protection device connected in parallel with input connections of an LED driver circuit, the surge protection device including first and second surge suppression circuits and at least an indicator lamp coupled therebetween;
    supplying current to activate an indicator lamp during a normal operating mode; and
    responsive to a short circuit failure mode wherein the surge protection device functions as an open circuit to shut off the indicator lamp as a visual indication of failure.

* * * * *